United States Patent
Habara et al.

(10) Patent No.: US 9,864,021 B1
(45) Date of Patent: *Jan. 9, 2018

(54) MAGNETIC RESONANCE IMAGING APPARATUS AND OPERATING METHOD THEREOF

(71) Applicant: HITACHI, LTD., Tokyo (JP)

(72) Inventors: Hideta Habara, Tokyo (JP); Masahiro Takizawa, Tokyo (JP); Masaharu Ono, Tokyo (JP); Kenta Sakuragi, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/440,580

(22) Filed: Feb. 23, 2017

(30) Foreign Application Priority Data

Jan. 4, 2017 (JP) .................. 2017-000200

(51) Int. Cl.
*G01V 3/00* (2006.01)
*G01R 33/28* (2006.01)
*G01R 33/36* (2006.01)

(52) U.S. Cl.
CPC ....... *G01R 33/288* (2013.01); *G01R 33/3671* (2013.01)

(58) Field of Classification Search
CPC .................................................. G01R 33/288
USPC ........................................ 324/314, 322, 318
See application file for complete search history.

(56) References Cited

U.S. PATENT DOCUMENTS

| | | | |
|---|---|---|---|
| 8,531,184 B2 | 9/2013 | Ito et al. | |
| 2014/0232401 A1* | 8/2014 | Takagi | G01R 33/56 324/309 |
| 2014/0292337 A1 | 10/2014 | Adalsteinsson et al. | |
| 2015/0002147 A1 | 1/2015 | Fontius et al. | |
| 2015/0015254 A1* | 1/2015 | Zhu | A61B 5/055 324/309 |
| 2017/0146620 A1* | 5/2017 | Habara | A61B 5/055 |

FOREIGN PATENT DOCUMENTS

| | | |
|---|---|---|
| JP | 2013-27524 | 2/2013 |
| JP | 5337162 | 11/2013 |
| JP | 2014-204977 | 10/2014 |
| JP | 2016-131738 | 7/2016 |
| WO | WO 2016/009791 A1 | 1/2016 |

OTHER PUBLICATIONS

Apr. 25, 2017 Decision to Grant a Patent (and English translation thereof) in connection with corresponding Japanese patent application No. 2017-000200.

* cited by examiner

*Primary Examiner* — Louis Arana
(74) *Attorney, Agent, or Firm* — Cooper & Dunham LLP

(57) ABSTRACT

A radiofrequency antenna has a plurality of channels. A Q-value calculating unit computes reflected signals of the plurality of channels of the radiofrequency antenna, respectively, in a case where transmission signals as electrical signals are simultaneously supplied to the plurality of channels of the radiofrequency antenna, also including a signal obtained when the transmission signal supplied to one channel of the plurality of channels is reflected from another channel, and computes a Q value of the radiofrequency antenna using the reflected signal. An SAR calculating unit calculates a specific absorption rate (SAR) using the Q value.

14 Claims, 8 Drawing Sheets

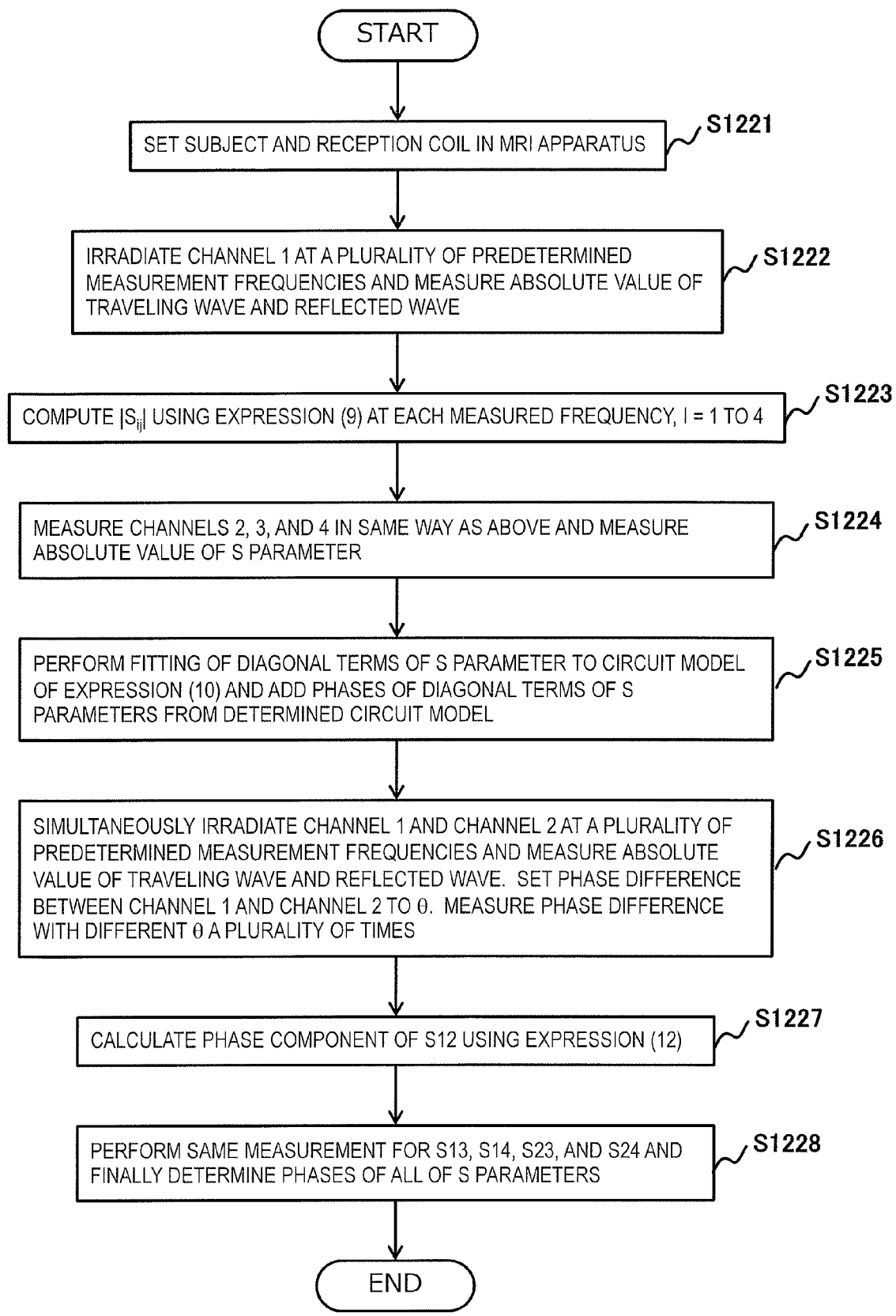

MAGNETIC RESONANCE IMAGING APPARATUS AND OPERATING METHOD THEREOF

BACKGROUND OF THE INVENTION

Field of the Invention

The present invention relates to a magnetic resonance imaging apparatus, particularly, to technique of controlling a specific absorption rate (SAR) as an index indicating an influence of a radiofrequency radio wave on a human body.

Background Art

In a magnetic resonance imaging apparatus (hereinafter, referred to as an "MRI apparatus"), an object disposed in a homogenous magnetostatic field that is generated by a magnetostatic field magnet is irradiated with a radiofrequency pulse (hereinafter, referred to as an "RF pulse") as an electromagnetic wave, nuclear spin is excited in the object, an NMR signal as the electromagnetic wave generated through the nuclear spin is received and is subjected to signal processing, and thereby an image of the object is acquired.

In order to irradiate the object with the RF pulse in the MRI apparatus, control needs to be performed such that the object irradiated with the RF pulse does not suffer from an increase in temperature due to heating action of the RF pulse or a burn. Regarding SAR as a specific absorption rate of radiofrequency wave (radio wave) into a human body, there are provided safety standards such as the International Electrotechnical Commission (IEC) standards, and thus, in the MRI apparatus, strict and accurate management of the SAR (SAR management) is performed in accordance with the standards. Normally, in the MRI apparatus that generates a magnetostatic field of three teslas or higher, irradiation power of the RF pulse is monitored in real time on an SAR monitor and the SAR management is performed.

In the MRI apparatus, irradiation with the RF pulse and reception of the NMR signal are performed by an antenna device (hereinafter, referred to as an "RF antenna") which is called an RF antenna or an RF coil that transmits or receives an electromagnetic wave having a radio frequency. In order to perform the irradiation with the RF pulse, as in the following Expression (1), power $P_{input}$ of a transmission signal that is input to the RF antenna is represented by a sum of antenna power consumption $P_{antenna}$ that is consumed in the RF antenna and results in producing heat in the RF antenna and object power consumption $P_{object}$ that is consumed by an object and results in producing heat in the object.

$$P_{input} = P_{antenna} + P_{object} \qquad (1)$$

Therefore, in order to perform an accurate SAR management, it is necessary to find accurate object power consumption $P_{object}$. It is possible to calculate the object power consumption $P_{object}$ in Expression (1), for example, using a Q value of resonance of the RF antenna. Specifically, in "NMR imaging in biomedicine" by Mansfield, P. et al., in Academic Press, N Y. 1982, p. 313, it is disclosed that a Q value ($Q_{empty}$) obtained in a state in which no object (patient) enters the inside of the RF antenna and a Q value ($Q_{loaded}$) obtained in a state in which an object enters the inside of the RF antenna are acquired through measurement, and it is possible to calculate the object power consumption $P_{object}$ by the following Expression (2) by using the values. In other words, in Expression (2), the antenna power consumption $P_{antenna}$ is computed from $P_{antenna} = Q_{loaded}/Q_{empty} * P_{input}$.

$$P_{object} = P_{input} * \left(1 - \frac{Q_{loaded}}{Q_{empty}}\right) \qquad (2)$$

SUMMARY OF THE INVENTION

In recent years, a transmitting RF antenna has a configuration in which a plurality of coils (transmission channels (hereinafter, simply referred to as "channels")) are combined, and the number of the channels is tend to increase (for example, 2 to 16 channels). The RF antenna having the plurality of channels has irradiation power (amplitude) or a phase that are optimized for each channel, and thereby it is possible to perform RE shimming in which an irradiation field B1+ formed of the RF pulse, with which the irradiation is performed, has high spatial homogeneity.

On the other hand, regarding the SAR management, when the accurate object power consumption $P_{object}$ of the RF antenna provided with the plurality of channels is obtained, a Q value ($Q_{empty}$) obtained in a state in which no object (patent) enters the inside of the RF antenna and a Q value ($Q_{loaded}$) obtained in a state in which an object enters the inside of the RF antenna are measured for each channel and the Q values are computed. Therefore, it is necessary to compute the object power Consumption $P_{object}$ from Expressions (1) and (2) above for each channel and to sum the object power consumptions.

Further, in a case where coupling occurs between the channels of the RF antenna including two or more channels, it is necessary to contain an influence of the coupling into the calculation of the object power consumption $P_{object}$ for each channel, and it is not possible to calculate correct object power consumption $P_{object}$ from only Expressions (1) and (2) above. Here, the coupling between the channels means that a part of power incoming from a channel 1 returns as retrograde waves from a channel 2, and/or that a part of power incoming from the channel 2 returns as retrograde waves from the channel 1. Here, the power scattered from the channel 1 to the channel 2 is referred to as the retrograde wave of the channel 2; however, when the entire antenna is considered one system, it is possible to consider the returning as reflection, and thus the retrograde wave is referred to as a reflected wave in some cases.

It is possible to determine whether or not the coupling occurs between channels in an antenna including two or more channels, by actually performing irradiation from one channel and measuring retrograde waves at the other channel. In a case where the coupling does not occur between the channels of the RF antenna, $Q_{loaded}$ and $Q_{empty}$ do not change regardless of values of the amplitude and the phase (hereinafter, referred to as "RF shimming parameters"), which are optimized through RF shimming, of a transmission signal (electrical signal) which is supplied to the channels. Therefore, power with which the irradiation is performed to a certain channel produces zero retrograde wave at the other channels other than retrograde waves produced at the channel. However, actually, it is possible to determine power with which the irradiation is performed from one channel of an antenna including two or more channels, as retrograde waves of the other channel. This means that the coupling occurs between the channels of the RF antenna. In general, in a case where coupling occurs between channels, the Q values of antennas are reduced, compared to the case where the coupling does not occur. Since the magnitude of the coupling between the channels varies depending on a positional relationship between the RF antenna and an object with respect to the RF antenna, it is difficult to theoretically find a relationship between input power $P_{input}$ to the RF antenna and consumption power $P_{object}$ in the object, and thus it is difficult to calculate the Q value with accuracy. Therefore, in the related art, it has been difficult to calculate an SAR estimate accurately and rapidly in an antenna in which coupling occurs.

When the object power consumption $P_{object}$ is estimated to be higher than the actual power, that is, when the SAR is overestimated, the MRI apparatus is likely to determine that irradiation power reaches the upper limit value, although an RF pulse of irradiation power, with which a human body is actually irradiated, is lower than the upper limit value specified in safety regulations. Then, it takes a long time to acquire an image, or the number of acquired images is reduced. Thus, problems arise in that images are acquired in a state in which it is not possible to perform irradiation with the RF pulse having sufficient irradiation power and an image quality is degraded. Conversely, when the object power consumption $P_{object}$ is estimated to be lower than the actual power, that is, when the SAR is underestimated there is a concern that an object will be irradiated with an RF pulse of power higher than the limit value.

The invention is made in consideration of the circumstances described above, and thus an object thereof is to perform SAR management with accuracy in an RF antenna including a plurality of channels.

In order to achieve the object, according to the invention, there is provided an MRI apparatus including: a radiofrequency antenna that irradiates an object disposed in an imaging space with a radiofrequency pulse; a Q-value calculating unit that computes a Q value of the radiofrequency antenna; and an SAR calculating unit that calculates a predicted value of a specific absorption rate in the object, using the Q value in a case of performing irradiation with a radiofrequency pulse from the radiofrequency antenna. Here, the radiofrequency antenna includes a plurality of channels, the Q-value calculating unit computes reflected signals of the plurality of channels of the radiofrequency antenna, respectively, in a case where transmission signals as electrical signals are simultaneously applied to the plurality of channels of the radiofrequency antenna, also including a signal that is a retrograde wave when the transmission signal supplied to one channel of the plurality of channels turns back from another channel, and computes the Q value of the radiofrequency antenna using the reflected signal.

According to the invention, it is possible to compute the Q value to which the influence of the coupling between the channels is added, and thus to perform a SAR management with high accuracy for the RF antenna including the plurality of channels.

BRIEF DESCRIPTION OF THE DRAWINGS

FIG. 8 is a flowchart illustrating operations of computing a scattering matrix S of a third embodiment of the invention.

DETAILED DESCRIPTION OF THE INVENTION

Hereinafter, an MRI apparatus according to an embodiment of the invention will be described with reference to the figures.

First Embodiment

Entire Configuration of MRI Apparatus

Figure 1:
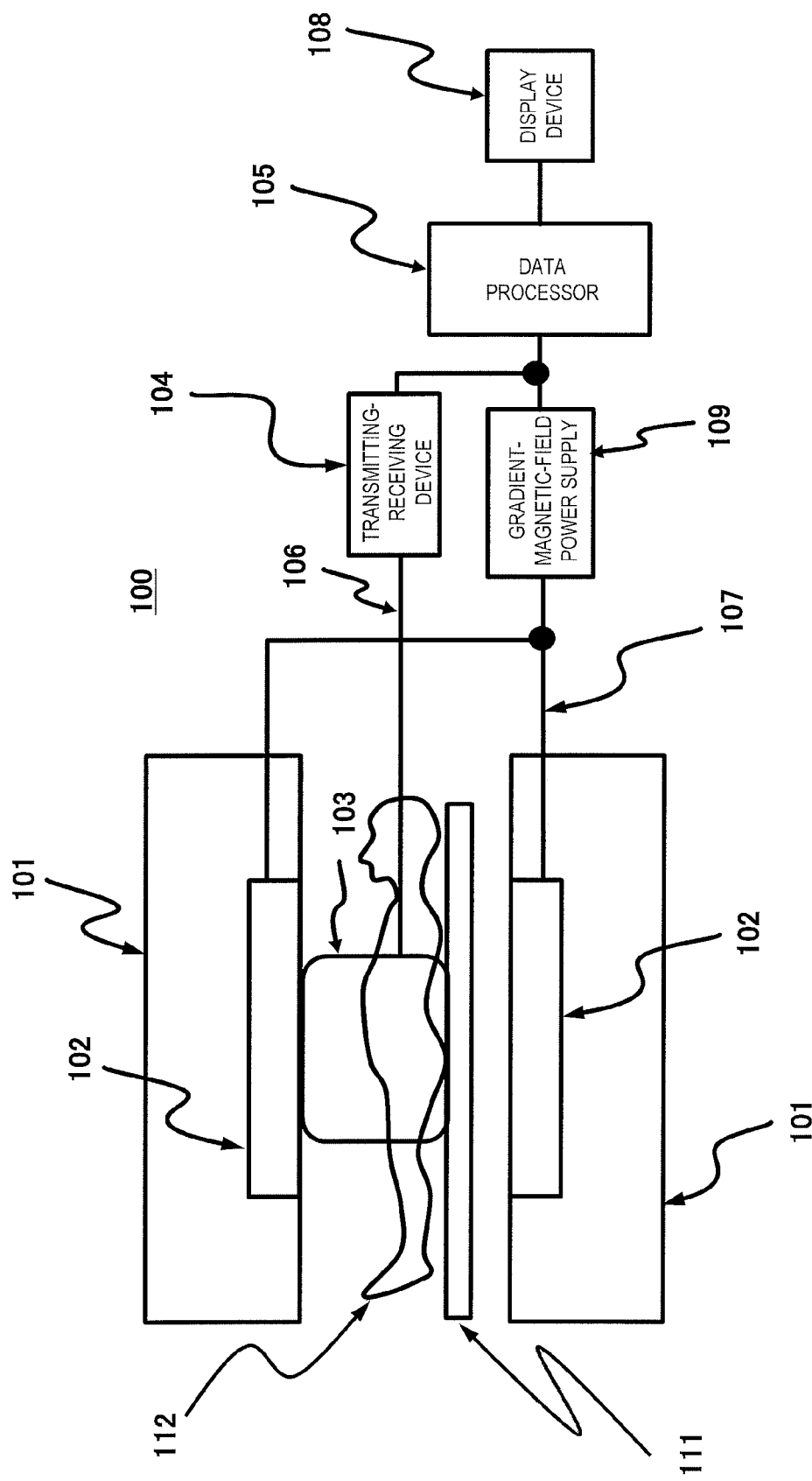
FIG. 1 is a block diagram illustrating a schematic configuration of an MRI apparatus of a first embodiment of the invention.

As schematically illustrated in FIG. 1, an MRI apparatus 100 according to the embodiment has such a configuration. The MRI apparatus 100 includes a magnet 101 that forms a magnetostatic field in an imaging space in which an object 112 is disposed, a gradient coil 102 that applies a magnetic field gradient in a predetermined direction to the magnetostatic field, an RF antenna 103 that transmits a radiofrequency (hereinafter, referred to as RF) signal to the object 112 and receives a nuclear magnetic resonance signal (NMR signal) which is generated from the object 112, a transmitting-receiving device 104 that generates a pulse waveform of a transmission signal (RF signal) which is supplied to the RF antenna 103, transmits the pulse waveform to the RF antenna 103, and performs signal processing on the NMR signal received by the RF antenna 103, a gradient-magnetic-field power supply 109 that supplies currents to the gradient coil 102, a data processor 105 that controls drive of the transmitting-receiving device 104 and the gradient-magnetic-field power supply 109 and performs various types of information processing and receives operations by an operator, a display device 108 for displaying a processing result of the data processor 105, and a bed 111 in which the object 112 is mounted.

The gradient-magnetic-field power supply 109 and the gradient coil 102 are connected via a gradient-magnetic-field control cable 107. In addition, the RF antenna 103 and the transmitting-receiving device 104 are connected via a transmitting-receiving cable 106 that transmits and receives signals between the RF antenna 103 and the transmitting-receiving device 104. The transmitting-receiving device 104 includes a synthesizer, a power amplifier, a receiving mixer, an analog-digital converter, a transmission reception switch, or the like (all not illustrated).

The RF antenna 103 uses an antenna of multi-channel transmission that resonates at a predetermined frequency and includes two or more channels. The RF antenna 103 may have any shape as long as a plurality of channels are included, and, for example, may be an antenna in which a plurality of, coils (channels) are disposed to be aligned in a row, or may be a birdcage type antenna.

In addition, the RF antenna 103 may be configured to perform not only irradiation with an RF pulse, but also reception of the NMR signal, or may include a reception dedicated antenna 323 instead of the RF antenna 103 for transmission. For example, an antenna configured of a plurality of antennas such as a combination of an RE antenna for imaging a wide range and an RF antenna for local imaging may be used as the RF antenna 103.

In a case of using the RF antenna 103 for transmission and the reception dedicated antenna 323, in order to image sites of a human body in detail, a big RF antenna that covers the entire body and is installed inside a gradient coil may be used for transmission, and a local RE antenna disposed to be close to the human body surface may be used for reception. In addition, a local transmitting-receiving RF antenna that performs both of the transmission and reception may also be locally disposed to be close to the human body. In this case, the local transmitting-receiving RF antenna is configured to include a plurality of channels.

The MRI apparatus 100 is distinguished to be a horizontal magnetic field type and a vertical magnetic field type in a direction of the magnetostatic field formed by the magnet 101. In a case of the horizontal magnetic field type, in general, the magnet 101 is provided with a bore (central space) having a circular cylindrical shape, generates a magnetostatic field in a horizontal direction in FIG. 1, and is referred to as a tunnel type MRI apparatus. On the other hand, in a case of the vertical magnetic field type, a pair of magnets are disposed on upper and lower sides with the object 112 interposed therebetween and generates a magnetostatic field in a vertical direction in FIG. 1.

The data processor 105 controls the transmitting-receiving device 104 and the gradient-magnetic-field power supply 109, intermittently irradiates the object 112 with the RF pulse and applies a gradient magnetic field to the object 112 disposed in the magnetostatic field from the RF antenna 103 and the gradient coil 102. The NMR signal that resonates with the RF pulse and is generated from the object 112 is received in the RF antenna 103, and is subjected to the signal processing in the data processor 105, and an image is re-formed. For example, the object 112 is a predetermined site of a human body. Further, the data processor 105 calculates reflection characteristics or a Q value for the channels of the RF antenna 103 and performs SAR management based on the reflection characteristics and the Q value. Calculation of a scattering matrix or the Q value and the SAR management performed in the data processor 105 will be described in detail.

Configuration of RF Transmitting-Receiving System

Figure 2:
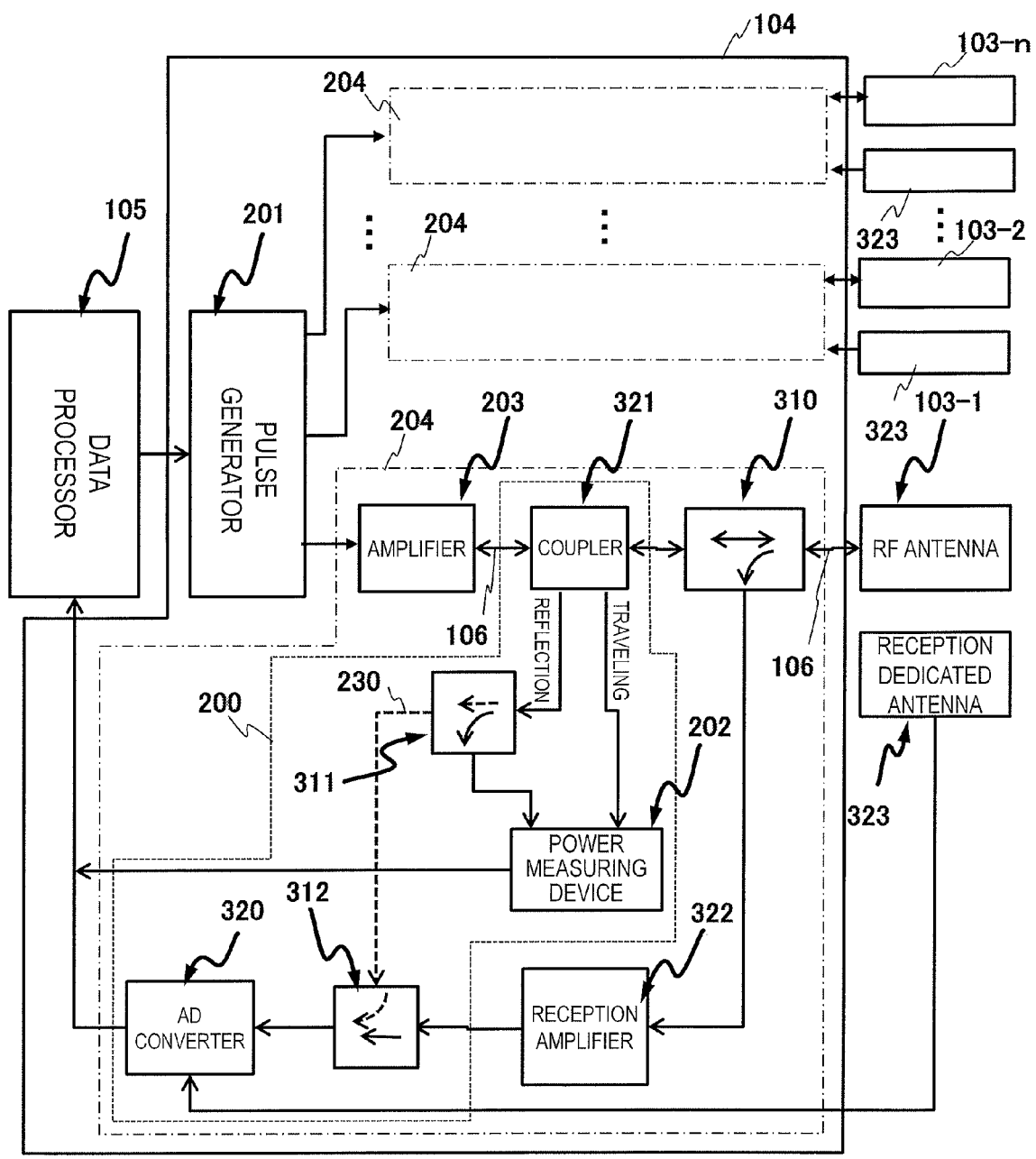
FIG. 2 is a block diagram of an RE transmission system of the first embodiment of the invention.

FIG. 2 illustrates a configuration of an RF transmitting system in the MRI apparatus described in FIG. 1 in detail. As illustrated in FIG. 2, the RF transmitting system includes the transmitting-receiving device 104, the transmitting-receiving cable 106, and the RF antenna 103 described above. The RF antenna 103 is described, as an example, with a case of including four channels (channels 103-1 to 103-4).

The transmitting-receiving device 104 includes a pulse generator 201 and a reception detection portion 204 disposed for each of the channels 103-1 to 103-4. The reception detection portion 204 includes an amplifier 203, a coupler 321, a power measuring device 202, a reception amplifier 322, an AD converter (waveform detecting unit) 320, and RF switches 310, 311, 312. The pulse generator 201 generates a pulse waveform (transmitting RF pulse) for irradiation with a desirable RF pulse from the RF antenna 103. Note that the transmitting RF pulse is generated for each of the channels of the RF antenna 103. The transmitting RF pulse is generated as a signal of which normal peak power is several milliwatts or less and is input to the amplifier 203. The amplifier 203 amplifies the input transmitting RF pulse to an RF wave of which the peak power is several kilowatts to tens of kilowatts, and the amplified signal is supplied as a transmission signal to the RF antenna 103 via the transmitting-receiving cable 106.

The transmitting-receiving cable 106 is an RF coaxial cable that connects the pulse generator 201 and the RF antenna 103 via the amplifier 203, the coupler 321, and the RF switch 310. It is necessary to provide the RF coaxial cable having high-voltage resistance between the amplifier 203 and the RF antenna 103. In the embodiment, the pulse generator 201 and the RF antenna 103 are connected for each channel. Therefore, the number of transmitting-receiving cables 106 is the same as the number of channels. In an example illustrated in FIG. 2, since the RF antenna 103 includes four channels, the RF antenna 103 and the pulse generator 201 are connected with four transmitting-receiving cables 106.

The channels 103-1 to 103-4 of the RF antenna 103, to which the transmission signals are supplied via the transmitting-receiving cable 106, irradiate the object 112 with the RF pulse. In addition, some of the transmission signals become retrograde waves which turn back from one channel to which the signal is supplied and other channels in which coupling occurs between the channel to which the signal is supplied and the other channels, and return to the reception detection portion 204 side.

The object 112 irradiated with the RF pulse generates the NMR signal. The NMR signal is received by the channels 103-1 to 103-4 of the RF antenna 103 and/or by the reception dedicated antenna 323.

The RF switch 310 is an RF switch corresponding to a high-power RF of tens of kilowatts and is a switch that switches between transmission and reception of an RF transmitting-receiving antenna. The NMR signal received in the RF antenna is separated from the transmission signals by the RF switch 310, input to the reception amplifier 322, and is amplified in the reception amplifier 322. The amplified NMR signal is input to an AD converter 320 and is subjected to sampling at a predetermined sampling cycle, thereby is converted into a digital signal, and is output to the data processor 105 from the AD converter 320. In addition, in a case where the reception dedicated antenna 323 is disposed, the NMR signal generated from the object 112 is received by the reception dedicated antenna 323, is subjected to the sampling and is converted into a digital signal in the AD converter 320, and is output to the data processor 105. The data processor 105 performs re-forming of an image or the like using the received signal.

The coupler 321 picks up very small traveling waves and reflected waves (for example, corresponding to about one hundred thousandth, or −50 dB) in proportional to the transmission signal (traveling wave), which passes through the coupler 321 toward the channels of the RF antenna 103 from the amplifier 203, and the reflected signal (reflected wave), which passes through the coupler 321 in a returning direction from the channel of the RF antenna 103 to the amplifier 203, respectively, and the coupler outputs the waves from predetermined terminals, respectively. The traveling wave picked up by the coupler 321 is input to the power measuring device 202 and power (amplitude) thereof is measured. The reflected wave picked up by the coupler 321 is input to the power measuring device 202 by the RF switch 311 and is also input to the AD converter 320 via the other RF switch 312. In this manner, the power (amplitude)

of the reflected wave picked up by the coupler 321 is measured by the power measuring device 202 and is subjected to the sampling by the AD converter 320, and the waveform thereof is detected. The measurement result in the power measuring device 202 and the detected waveform in the AD converter 320 are output to the data processor 105. Since the AD converter performs signal processing at detection time intervals shorter than the measurement in the power measuring device 202, the data processor 105 is capable of detecting not only an absolute value of the reflected wave, but also a phase thereof. Note that the RF switches 311 and 312 are low-power RF switches.

As described above, the coupler 321, the power measuring device 202, and the AD converter 320 configure a detector 200 that detects the reflected signal (reflected wave) for each of the channels 103-1 to 103-4. Note that the AD converter 320 not only detects the reflected signal, but also detects a received signal of the NMR signal; however, since the reflected signal and the NMR signal are generated at different timings, and the NMR signal is generated at the timing later than the timing at which the reflected signal is generated, both signals are not superimposed and it is possible to individually detect the waveforms of both signals by the AD converter 320.

Configuration of Data Processor

Figure 3:
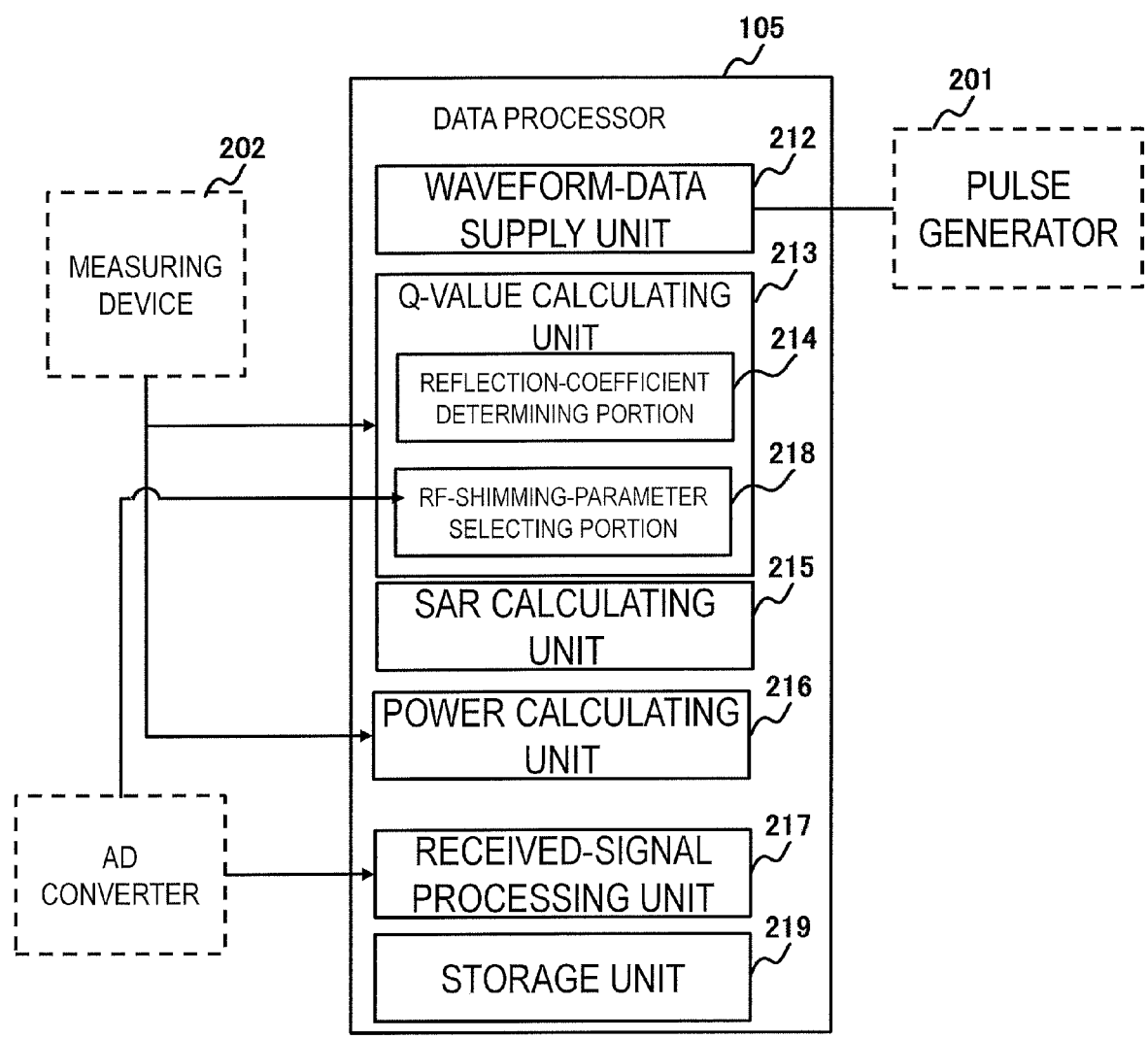
FIG. 3 is a functional block diagram of a data processor of the first embodiment of the invention.

As illustrated in FIG. 3, the data processor 105 includes a waveform-data supply unit 212 that instructs the pulse generator 201 to generate transmission signals which need to be generated, a Q-value calculating unit 213 that computes a Q value of the RF coil 103, an SAR calculating unit 215 that calculates, using the Q value, a predicted value of a specific absorption rate in the object in a case where the irradiation with the RF pulse is performed from the RF antenna 103, a power calculating unit 216 that calculates power $P_{input}$ of the transmission signal that is supplied to the RF antenna 103, a received-signal processing unit 217 that performs processing of the received signal of the NMR signal, re-forming of an image, or the like, and a storage unit 219 that stores a parameter or the like.

In the embodiment, the detector 200 detects reflected signals from the plurality of channels 103-1 to 103-4 in a case where the transmission signals are simultaneously supplied to the plurality of channels 103-1 to 103-4 of the RF antenna 103, also including turning-back signals generated due to the coupling between the channels. In other words, the detector 200 detects the reflected signals from the channels, including the signal generated when the transmission signal supplied to one channel of the plurality of channels turns back (is reflected) from another channel. The Q-value calculating unit 213 computes the Q value of the RF antenna using the reflected signals, and thereby obtaining the Q value in which coupling action between the channels are reflected. The SAR calculating unit 215 calculates a predicted value of a specific absorption rate in the object, using the Q value, in a case of performing irradiation with a RF pulse from the RF antenna 103. Accordingly, in the MRI apparatus of the embodiment, for the RF antenna including the plurality of channels, it is possible to compute the SAR to which the coupling action between the channels is added, with high accuracy, and it is possible to perform SAR management with high accuracy.

In the embodiment, as illustrated in FIG. 3, the Q-value calculating unit 213 is configured to have a reflection-coefficient determining portion 214 that computes a scattering matrix as a set of reflection coefficients for each channel. The reflection-coefficient determining portion 214 supplies the transmission signal as the electrical signal to one channel of the plurality of channels of the RF antenna 103 and causes the detector 200 to detect the reflected signal of the transmission signal by a radiofrequency antenna for each of the plurality of channels. This operation is repeated for the plurality of channels, and then the reflection-coefficient determining portion 214 computes the scattering matrix as the set of reflection coefficients for each channel. In this case, the Q-value calculating unit 213 computes the Q value using the scattering matrix computed by the reflection-coefficient determining portion 214.

Specifically, the reflection-coefficient determining portion 214 is configured to compute the reflection coefficient for each combination of a channel that has received the transmission signal with a channel that has output the reflected signal.

More specifically, the reflection-coefficient determining portion 214 computes a scattering matrix obtained in a state in which the object 112 is disposed in an imaging space, and the Q-value calculating unit 213 can be configured to compute the Q value using a scattering matrix obtained in advance in a state in which the object 112 is not disposed and a scattering matrix obtained by the reflection-coefficient determining portion 214 in a state in which the object 112 is disposed.

As more specific technique, the Q-value calculating unit 213 computes components of a vector which is obtained by multiplying the scattering matrix by a vector of which components are the transmission signals that are simultaneously supplied to the plurality of channels, divides the transmission signals by the components of the vector, respectively, and thereby obtains a reflection vector representing the reflected signal for each channel. The Q-value calculating unit 213 is capable of calculating the Q value using the reflection vector.

At this time, since the detector 200 is configured to be capable of detecting an absolute-value component and a phase component of the reflected signal, the reflection-coefficient determining portion 214 is capable of computing the reflection coefficient as a complex number using the absolute-value component and the phase component of the reflected signal.

In addition, the Q-value calculating unit 213 may further include an RF-shimming-parameter selecting portion 218. The RF-shimming-parameter selecting portion 218 converts the transmission signal, which is supplied for each channel, into a plurality of types of transmission signals and obtains reflection vectors thereof. The RF-shimming-parameter selecting portion 218 selects, of the plurality of types of transmission signals, a transmission signal having variations (homogeneity) of magnetic field distribution of the RF pulse with which irradiation is performed from the RF antenna 103, in which the variations has a predetermined value or lower, using the plurality of obtained reflection vectors. In this manner, the Q-value calculating unit 213 is able to also realize RF shimming.

Hereinafter, operations of the units of the data processor 105 when imaging is performed using the MRI apparatus of the embodiment are described with reference to a flow in FIG. 4.

In addition, at a timing of apparatus maintenance or the like before the imaging, scattering matrices S of the RF antenna 103 which are expressed in Expression (3) are computed for the transmission signals of three or more different frequencies f set in advance in a state (no-load state) in which the object is not disposed in the imaging space (S1201). Elements $S_{ij}$ of the scattering matrix S are reflection coefficients of the channels of the RF antenna 103, the first subscript i represents a channel number of a channel of which a reflected wave is measured, and the second subscript j represents a channel number of a channel to which a transmission signal, which is subjected to reflection, is input. For example, $S_{21}$ represents a ratio (reflection coefficient) of the transmission signal input to the channel 1, which returns as a reflected wave from the channel 2. Note that Expression (3) shows an S matrix obtained in a case where the number of channels is M. In the following description, the case where the number M of channels is 4 is described as an example. In addition, the four channels are referred to as channels 1 to 4, respectively.

$$S = \begin{pmatrix} S_{11} & \cdots & S_{1j} & \cdots & S_{1M} \\ \vdots & \ddots & \vdots & \ddots & \vdots \\ S_{i1} & \cdots & S_{ij} & \cdots & S_{iM} \\ \vdots & \ddots & \vdots & \ddots & \vdots \\ S_{M1} & \cdots & S_{Mj} & \cdots & S_{MM} \end{pmatrix} \quad (3)$$

Figure 5:
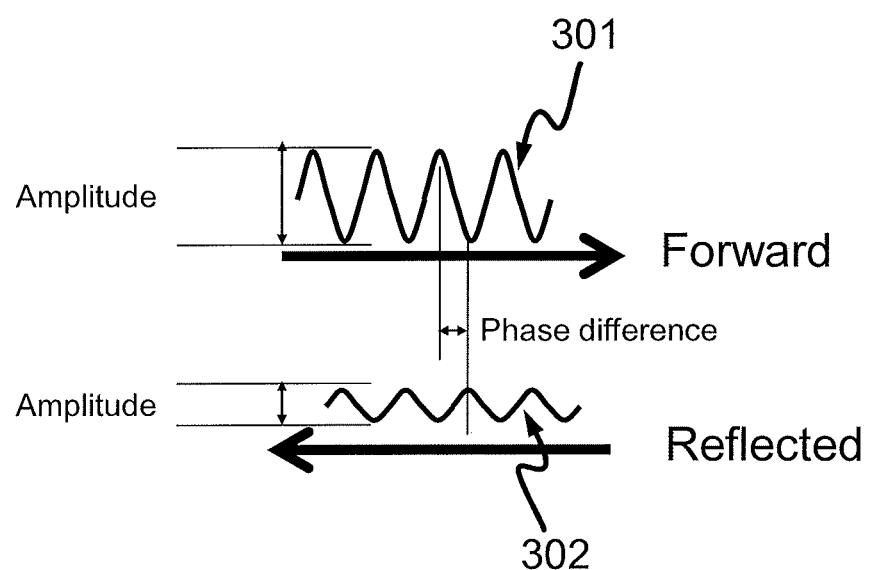
FIG. 5 is a diagram illustrating a relationship between an amplitude and a phase of a transmission signal (traveling wave) and a reflected signal (reflected wave) which are supplied to an RF antenna.

In Step S1201, in order to compute the scattering matrix S, the reflection-coefficient determining portion 214 instructs the waveform-data supply unit 212, causes the pulse generator 201 to generate a transmission signal that has a predetermined frequency and predetermined intensity which are set in advance, causes the transmission signal to be amplified in the amplifier 203, and supplies the transmission signal to only the channel 1. The power (amplitude) of the transmission signal is measured by the power measuring device 202. The phase of the transmission signal is the phase of the transmission signal generated by the pulse generator 201. FIG. 5 illustrates a waveform 301 of the transmission signal (traveling wave).

When input impedance of the channel 1 of an irradiating antenna varies from impedance of the transmitting-receiving cable, a reflected signal (reflected wave) is generated in the channel 1 from the transmission signal supplied to the channel 1. In addition, in a case where coupling occurs between the channels, the reflected signals are also generated in the other channels 2 to 4. In the detector 200 of the reception detection portion 204 of each of the channels, the power (amplitude) and the waveform of the reflected signal are measured by the power measuring device 202 and the AD converter 320. The reflection-coefficient determining portion 214 computes the amplitudes and the phases, using the wave-forms of the reflected waves of the channels 1 to 4, which are detected by the AD converter 320. As illustrated in FIG. 5, the waveform 302 of the reflected wave has an amplitude and a phase which are different from those of the waveform 301 of the traveling wave. The reflection-coefficient determining portion 214 computes a rate (reflection coefficient) of the waves in which the waveforms of the traveling wave and the reflected wave are expressed as complex numbers including the amplitudes and the phases thereof. The reflection coefficients computed for the channels, respectively, in which the reflected waves are measured, are elements $S_{11}$, $S_{21}$, $S_{31}$, and $S_{41}$ of the scattering matrix S.

The reflection-coefficient determining portion 214 performs supply of the transmission signals and measurement of the reflected signals for the channels 2, 3, and 4, in this order, thereby computing the elements of the 4×4 scattering matrix S.

The reflection-coefficient determining portion 214 converts a frequency of the transmission signal into predetermined three or more frequencies and computes the scattering matrices S, respectively. For example, the scattering matrices S are measured for 11 frequencies from 122.5 MHz to 124.5 MHz by every 0.2 MHz.

The reflection-coefficient determining portion 214 stores the measured scattering matrices S in the storage unit 219.

Next, the data processor 105 displays a view on the display device 108, which urges an operator to dispose both of the object 112 and the reception dedicated antenna 323, as necessary, in the imaging space (S1202).

Next, the data processor 105 executes known pre-scanning, determination of an irradiation frequency of the RF pulse with which the RF antenna 103 performs the irradiation, determination of shimming of a magnetostatic field B0 that is formed by the magnet 101 and reception gain of the reception amplifier 322, determination of irradiation gain of the amplifier 203, acquisition of distribution (B1 map) of a magnetic field B1 of the RF pulse with which the RF antenna 103 performs the irradiation, and so on (S1203).

Next, the reflection-coefficient determining portion 214 measures the scattering matrix S of the RF antenna 103 in a state in which the object 112 is disposed in the imaging space. Impedance Z of the RF antenna 103 varies largely depending on a size, body composition, and the like of the object 112 that is disposed inside the RF antenna 103. In a case where a big object 112 enters the inside of the RF antenna 103 or the object 112 is disposed to be close to a conductor of the RF antenna 103, the load of the RF antenna 103 increases and the impedance Z varies (decreases). Therefore, the scattering matrix S is measured in a state in which the object 112 is disposed. Specifically, complex diagonal terms and non-diagonal terms of the scattering matrix are measured in the state in which the object 112 is disposed (S1204). The measurement method is the same as that in Step S1201.

In order to perform irradiation with the RF pulse having high spatial homogeneity of an irradiation field through RF shimming, transmission signals h1, h2, h3, and h4 which are supplied to the channels 1 to 4 of the RF antenna 103 are referred to as "RF shimming parameters". The transmission signals h1, h2, h3, and h4 are signals in which the amplitude and the phase are expressed as complex numbers. The storage unit 219 stores a set of RF shimming parameters h which can be selected, for each site of the object 112. Currently, the Q-value calculating unit 213 reads, from the storage unit 219, the set of the RF shimming parameters h which can be selected, according to the sites of the object 112 which is disposed in the imaging space (S1205).

Next, for the three or more frequencies, and for scattering matrices obtained in a case where no load is applied (without the object) computed in Step S1201 and scattering matrices S obtained in a case where a load is applied (with the object) computed in Step S1206, the Q-value calculating unit 213 computes reflection vectors $S_{simul}$ including elements of reflection coefficients $S_{simul1}$, $S_{simul2}$, $S_{simul3}$, and $S_{simul4}$, which are generated in the channels 1 to 4 in a case where the transmission signals having the amplitudes and the phases of the RF shimming parameters h are simultaneously supplied to the channels 1 to 4, by Expression (4) (S1206).

$$\begin{pmatrix} S_{simul_1} \\ S_{simul_2} \\ S_{simul_3} \\ S_{simul_4} \end{pmatrix} = \begin{pmatrix} 1/h_1 & 0 & 0 & 0 \\ 0 & 1/h_2 & 0 & 0 \\ 0 & 0 & 1/h_3 & 0 \\ 0 & 0 & 0 & 1/h_4 \end{pmatrix} \cdot \begin{pmatrix} S_{11} & S_{12} & S_{13} & S_{14} \\ S_{21} & S_{22} & S_{23} & S_{24} \\ S_{31} & S_{32} & S_{33} & S_{34} \\ S_{41} & S_{42} & S_{43} & S_{44} \end{pmatrix} \cdot \begin{pmatrix} h_1 \\ h_2 \\ h_3 \\ h_4 \end{pmatrix} \quad (4)$$

The Q-value calculating unit 213 computes the impedance Z for each of the channels 1 to 4 by substituting S in Expression (5) with the reflection coefficients $S_{simul1}$, $S_{simul2}$, $S_{simul3}$, and $S_{simul4}$, of the three or more frequencies in each of the case where no load is applied and the case where the load is applied, which are computed as described above. Note that $Z_0$ is characteristic impedance of a system.

$$Z = Z_0 \frac{1+S}{1-S} \quad (5)$$

The Q-value calculating unit 213 plots when the horizontal axis represents a frequency f and the vertical axis represents the impedance Z, which is computed by Expression (5), for three or more frequencies 3 in each of the case where no load is applied and the case where a load is applied. A peak of the impedance Z of the channel is computed from the plot results, both of the frequency f ($|Z|_{max}$) and a peak width $\delta f$ of the impedance are computed when the peak becomes the maximum value $|Z|_{max}$, and a Q value ($Q_{loaded i}$) in the case where a load is applied and a Q value ($Q_{empty i}$) in a case where a load is not applied are calculated from Expression (6) (S1206). The peak width $\delta f$ is a width of a frequency of the peak at a position at which the impedance Z is $1/\sqrt{2}$ times the maximum value $|Z|_{max}$.

$$Q = \frac{f(|Z|_{max})}{\delta f} \quad (6)$$

The SAR calculating unit 215 calculates object power consumption $P_{object}$ for each channel by Expression (7), and divides it by a weight of the object, thereby calculating predicted values of whole-body SAR of the channels (Step S1206).

$$P_{object} = \sum_{i=1}^{M} P_{input_i} * \left(1 - \frac{Q_{loaded\_i}}{Q_{empy\_i}}\right) \quad (7)$$

$Q_{empty\_i}$ represents a Q value of the channel i in the state where no load is applied, $Q_{loaded\_i}$ represents a Q value of the channel i in the state where the load is applied, and $P_{input_i}$ represents incident power to the channel i. Here, it is possible to compute the incident power $P_{input_i}$ of the channel i by Expression (8). Here, $P_{fwdi}$ represents traveling wave power of the channel i, $P_{refi}$ represents reflected wave power, and the SAR calculating unit 215 uses a value measured by the power measuring device 202.

$$P_{input_i} = P_{fwd_i} - P_{ref_i} \quad (8)$$

Through the processes described above, the SAR calculating unit 215 computes predicted values of the whole-body SAR for each of the RF shimming parameters h read in Step S1205 (S1206).

The RF-shimming-parameter selecting portion 218 selects the optimal RF shimming parameter h in imaging in which the predicted value of the whole-body SAR is within a predetermined range from the predicted values of the whole-body SAR for each of RF shimming parameters h computed in Step S1206, a map of the magnetic field B1 of the RF pulse measured in Step S1203 and so on, when the homogeneity of the distribution of the magnetic field of the RF pulse is a predetermined value or lower (S1207).

The data processor 105 executes main imaging of the object 112 using the RF shimming parameter h selected in Step S1207. In other words, the waveform-data supply unit 212 instructs the pulse generator 201 to generate the pulse waveform at the timing in accordance with a predetermined pulse sequence, and supplies, to the channels of the RF antenna 103, transmission signals of the intensity distribution depending on the RF shimming parameters h, and the object 112 is irradiated with the RF pulse. In addition, the gradient-magnetic-field power supply 109 is instructed to apply a gradient magnetic field to the object 112 at a predetermined timing. The NMR signal generated by the object 112 is received by the reception dedicated antenna 323 or the RF antenna 103, and is subjected to sampling by the AD converter 320. The received-signal processing unit 217 of the data processor 105 performs processing on output of the AD converter 320 and re-forms an image. At this time, the power measuring device 202 measures actual traveling wave power and reflected wave power.

In this main imaging, the power measuring device 202 measures the traveling wave power and the reflected wave power, and the SAR calculating unit 215 calculates the values of the whole-body SAR in the main imaging through a known calculation method. The SAR management, in which the intensity of the RF pulse is adjusted, is performed according to the values of the whole-body SAR through known technique (S1208).

As described above, in the embodiment, the RF shimming parameter h is multiplied by the reflection coefficient S, the reflection coefficients (reflection vectors) of the channels in the case where the transmission signals are simultaneously supplied to the channels are computed, the Q value is calculated by using the values, and the SAR is calculated. In this manner, since it is possible to compute the reflection coefficients to which the reflected signal generated due to the coupling between the channels is added, it is possible to calculate the predicted values of the SAR of the RF antenna in which coupling occurs with high accuracy. Accordingly, it is possible to perform the SAR management with high accuracy.

In the embodiment, the data processor 105 is configured to include a CPU, a memory, and a storage device, and it is possible to realize functions of the units (the Q-value calculating unit 213 and the SAR calculating unit 215) or the like which are executed by the data processor 105, by executing a program stored in the storage device with software which is loaded in the memory and is executed by the CPU of the data processor 105. In addition, all or some of the functions of the data processor 105 may be realized by hardware such as an application specific integrated circuit (ASIC), a field-programmable gate array (FPGA), or the like. In addition, various items of information used for the processes of the functions and various items of data generated during the process are stored in the storage device (storage unit 219).

Second Embodiment

In a second embodiment, a case of an MRI apparatus having a configuration in which it is possible to measure absolute values (amplitudes) of the traveling wave and the reflected wave of the RF; however, it is not possible to measure the phase is described.

The detector 200 of the MRI apparatus of the second embodiment is substantially the same as the detector 200 in FIG. 2 of the first embodiment; however, the second embodiment has a configuration in which the reflected wave detected by the coupler 321 is input only to the power measuring device 202 and is not input to the AD converter 320. In other words, the MRI apparatus of the second embodiment does not include the RF switches 311 and 312 and the wire 230 that connects the coupler 321 and the AD converter 320 with each other in FIG. 2. Therefore, it is not possible to detect the phase of the reflected wave in the MRI apparatus of the second embodiment. In the embodiment, actually, the transmission signals of the RF shimming parameters h are simultaneously supplied to the channels 1 to 4, the reflected waves generated in the channels 1 to 4 are measured, and thereby computing the reflection vector $S_{simul}$ including elements of reflection coefficients $S_{simul1}$, $S_{simul2}$, $S_{simul3}$, and $S_{simul4}$.

To be more specific, in the embodiment, the reflection-coefficient determining portion 214 computes the scattering matrix S using only the absolute-value component of the reflected signal. The Q-value calculating unit 213 calculates the Q value from the scattering matrix S computed by using only the absolute-value component. The SAR calculating unit 215 calculates the predicted value of the SAR using the Q value. The Q-value calculating unit 213 computes, for each channel, a combination (RF shimming parameter) of the transmission signals in which the predicted value of the SAR is within a predetermined range, then, actually supplies the transmission signals of the RF shimming parameters to the channels, and recalculates the Q value, using the reflected signal for each channel, which is actually detected by the detector 200. The SAR management of the main imaging is performed, using the recalculated Q value.

In this manner, the detector 200, which is capable of detecting only the absolute-value component, is also capable of computing the Q value, using a reflected wave matrix to which the coupling between the channels is added. In addition, irradiation with the RF pulse is actually performed using the RF shimming parameter selected using the Q value, the reflected wave is measured, the Q value is recalculated, and thereby it is possible to improve accuracy of calculation of the Q value. Accordingly, the SAR management of the main imaging is performed using the recalculated Q value, and thereby it is possible to improve accuracy of the SAR management.

Hereinafter, operations of the units of the data processor 105 when imaging is performed using the MRI apparatus of the embodiment are described with reference to a flow in FIG. 6. In a flow in FIG. 6, the same numbers are assigned to the same steps as those in the flow in FIG. 4 of the first embodiment.

Figure 4:
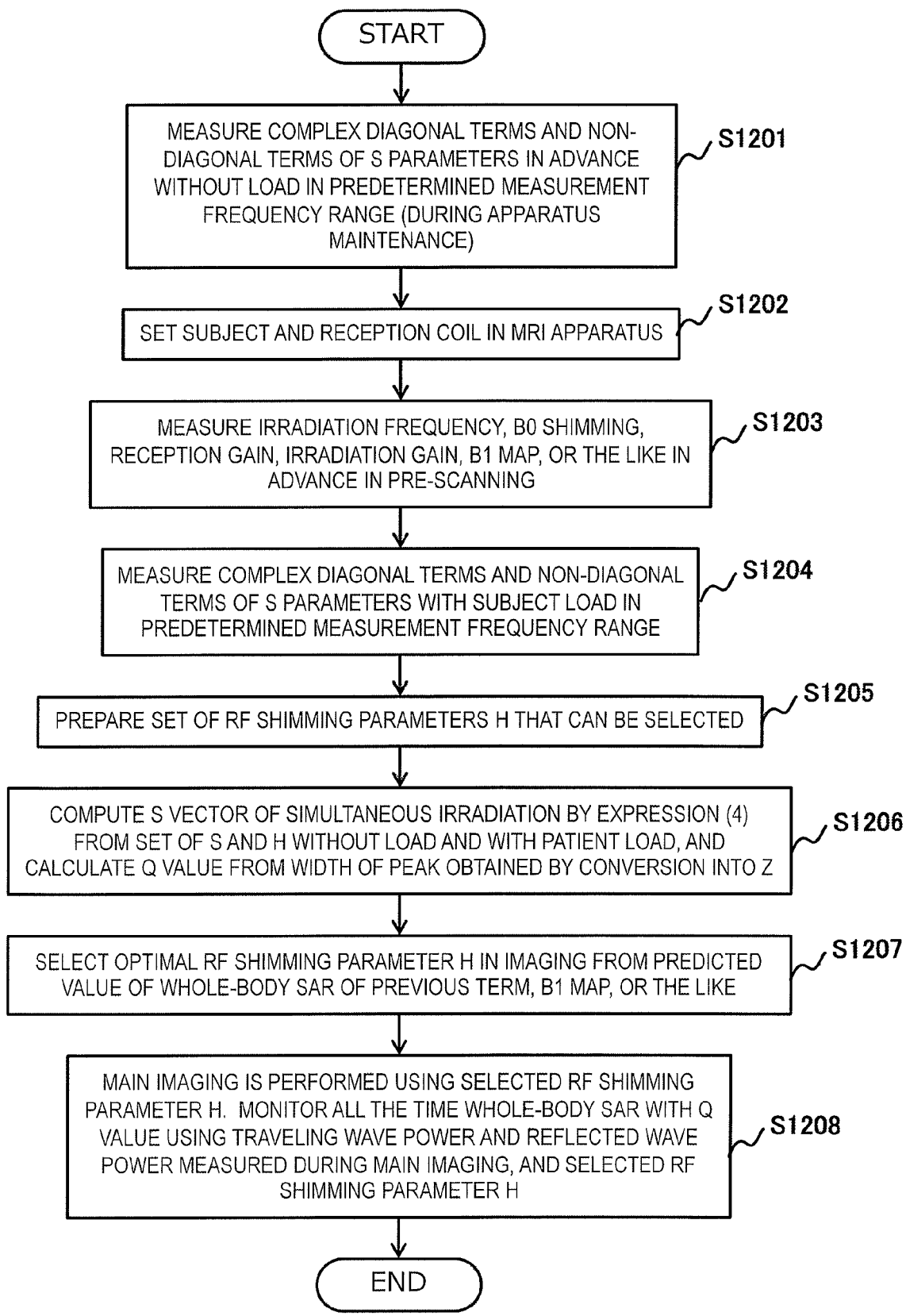
FIG. 4 is a flowchart illustrating operations of units during imaging by the MRI apparatus of the first embodiment of the invention.
Figure 6:
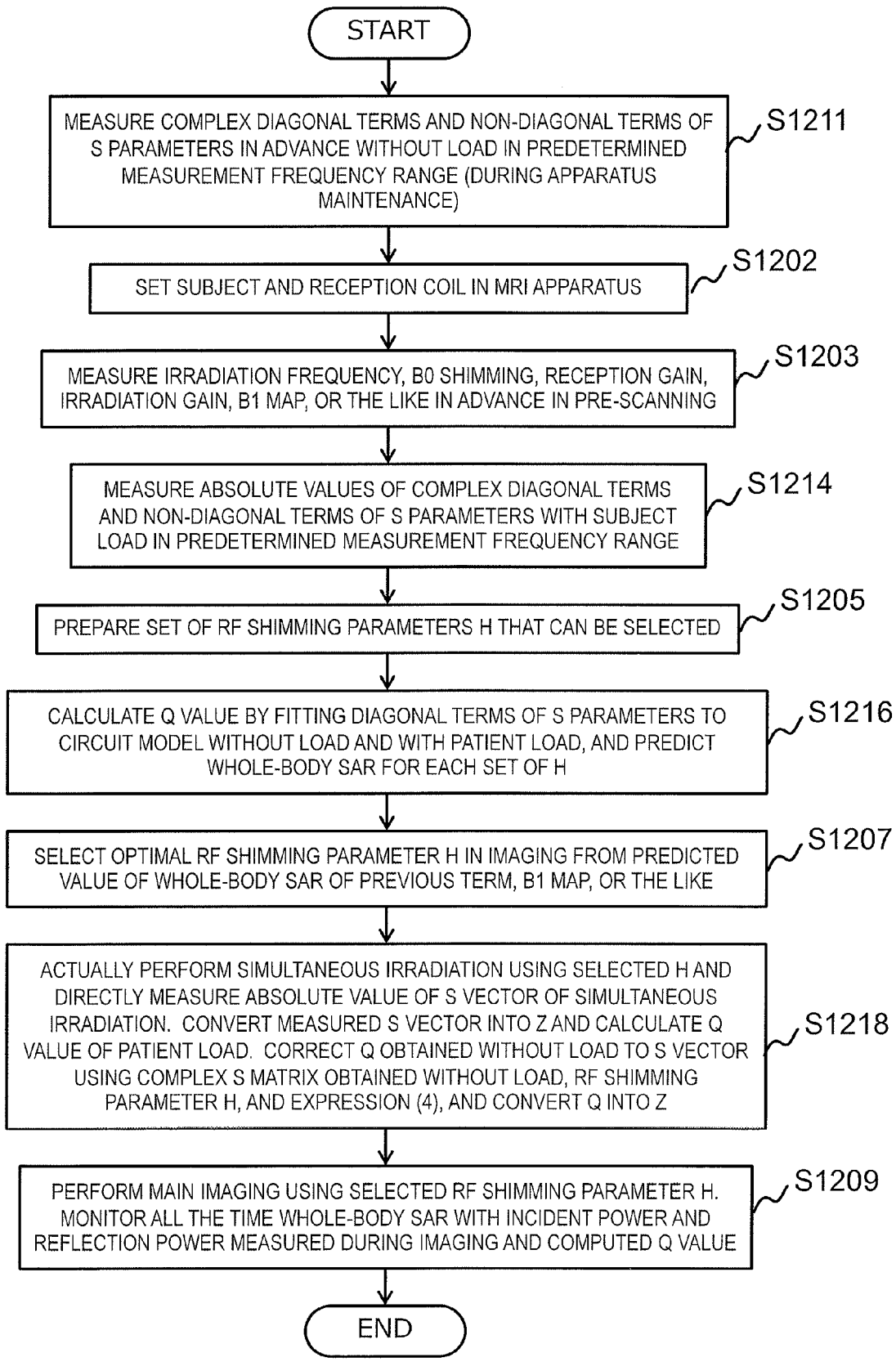
FIG. 6 is a flowchart illustrating operations of units during imaging by an MRI apparatus of a second embodiment of the invention.

In the flow in FIG. 6, in Step S1211, similar to Step S1201 in the flow in FIG. 4 of the first embodiment, the reflection-coefficient determining portion 214 inputs the transmission signal to each channel and the reflected waves of all of the channels are measured by the power measuring device 202. In this manner, the scattering matrix S is computed in a state in which the object is not disposed in the imaging space. Here, in the embodiment, the power measuring device 202 is capable of measuring the amplitudes of the traveling wave and reflected wave; however, it is not possible to measure the phase. Accordingly, the reflection-coefficient determining portion 214 calculates, using Expression (9), the square root of a value obtained by dividing, by amplitude $P_{fwdi}$(freq) of the traveling wave, amplitude $P_{refi}$(freq) of the reflected wave measured by the power measuring device 202, and thereby calculates the elements (the absolute values of the diagonal terms and the absolute values of non-diagonal terms) of the scattering matrix of Expression (3). A frequency of the transmission signal is converted into three or more frequencies and the scattering matrices S are computed, respectively.

$$|S_{i1}| = \left| \sqrt{\frac{P_{refi}(freq)}{P_{fwd_1}(freq)}} \right| \quad (9)$$

Steps S1202 and 1203 in FIG. 6 are performed, similar to those in the first embodiment.

Next, similar to Step S1204 of the first embodiment, the reflection-coefficient determining portion 214 computes the scattering matrix S in the loaded state in which the object is disposed in the imaging space; however, similar to Step S1211, the elements (the absolute values of the diagonal terms and the absolute values of non-diagonal terms) of the scattering matrix are calculated (S1214).

A set of the RF shimming parameters h which can be selected, for the sites of a patent is prepared (S1205).

Next, the Q-value calculating unit 213 performs fitting of the absolute values $|S_{11}|$, $|S_{22}|$, $|S_{33}|$, and $|S_{44}|$ of the diagonal-term components of the S matrix obtained in three or more frequencies under no load and the load in Steps S1211 and S1214, to an LCR circuit model expressed in Expression (10) which will be described below, and values (specific values of circuit elements) of L, C, and R corresponding to $|S_{11}|$, $|S_{22}|$, $|S_{33}|$, and $|S_{44}|$ are computed. In this manner, it is possible to compute the phase (S1216).

$$S = \frac{2\pi f Li + R - Z_0(1 - LiCi(2\pi f)^2 + 2\pi f RCi)}{2\pi f Li + R + Z_0(1 - LiCi(2\pi f)^2 + 2\pi f RCi)} \quad (10)$$

Figure 7:
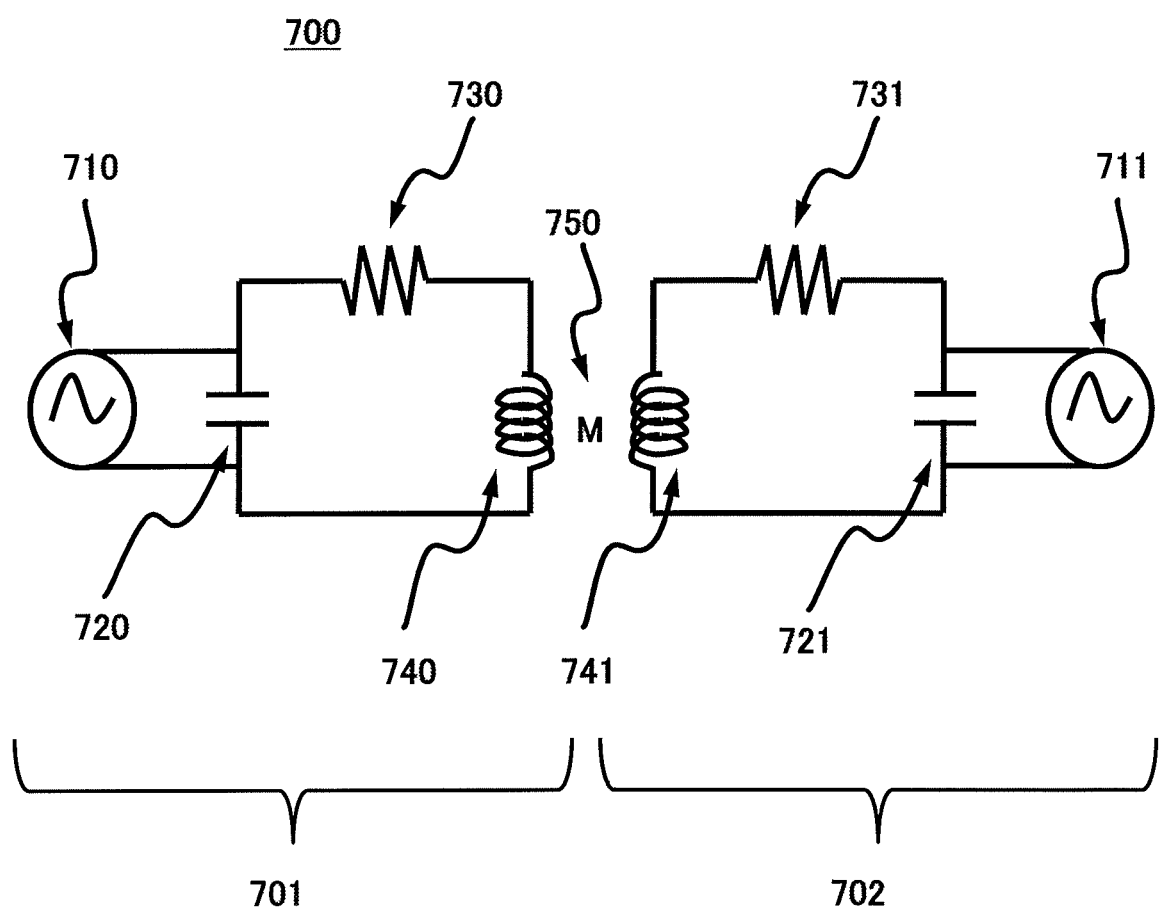
FIG. 7 is a diagram illustrating a resonance circuit model in which an LCR resonance circuit has two-channel simulation.

First, a calculation method of the L, C, and R values corresponding to the reflection vector $|S_{11}|$ is specifically described. The channels of the RF antenna 103 can be substituted with a simple LCR (an inductor, a capacitor, and a resistor) resonance circuit model in a narrow frequency range around the resonance frequency. FIG. 7 illustrates a resonance circuit model 700 of two channels of the RF antenna 103. The resonance circuit model 700 in FIG. 7 includes LCR resonance circuits 701 and 702 corresponding to two channels. The LCR resonance circuit 701 is formed of a loop with an inductor 740, a capacitor 720, and a resistor 730 which are connected in series. An RF frequency source 710 corresponding to the amplifier 203 that supplies the transmission signal is connected to the capacitor 720 in parallel and configures a parallel resonance circuit. Similarly, the LCR resonance circuit 702 is also configured to include three circuit elements of an inductor 741, a capacitor 721, and a resistor 731. The reflection coefficient S of the LCR resonance circuit 701 of the resonance circuit model 700 is expressed in Expression (10) using inductance L of the inductor 740, a capacity C of the capacitor 720, a resistance value R of the resistor 730, and a frequency f. $Z_0$ is characteristic impedance of a system. In other words, the reflection coefficient S is a function of f.

The Q-value calculating unit 213 performs the least square fitting with $|S_{11}|$ computed in Step S1223 as the left side S in Expression (10) using L, C, and R as parameters, and thereby the values of L, C, and R are effectively obtained. In the fitting, for example, an algorithm of the nonlinear least squared fitting on general purpose is used. In other words, the values of L, C, and R change from predetermined initial values in a predetermined range by a predetermined amount of the change, and a set of the values of L, C, and R which are best fitted is computed through the least squared method. When the set of L, C, and R is determined as described above, and then Expression (10) is substituted with an expression of the computed LCR, Expression (10) has the phase as a complex number, and thus it is possible to compute the phase of $S_{11}$. Similarly, the phases of $|S_{22}|$, $|S_{33}|$, and $|S_{44}|$ are computed (S1216).

Next, a Q value ($Q_{loadedi}$), in a case where the load is applied, and a Q value ($Q_{emptyi}$), in a case where the load is not applied, are calculated using Expression (11) of the obtained values of L, C, and R. The SAR calculating unit 215 calculates object power consumption $P_{object}$ for each channel by Expression (7), and divides it by a weight of the object, thereby calculating predicted values of whole-body SAR of the channels (Step S1216).

$$ReZ_{max} = \frac{L}{CR} \quad (11)$$

$$\omega_0 = \frac{1}{\sqrt{LC}}$$

$$Q = \frac{1}{R}\sqrt{\frac{L}{C}}$$

Note that $\omega_0$ is a resonance angular velocity of an LCR resonating system and $\omega_0 = 2\pi f_0$ with respect to the resonance frequency $f_0$.

The RF-shimming-parameter selecting portion 218 selects the optimal RF shimming parameter h from the predicted values of the whole-body SAR for each of RF shimming parameters h computed in Step S1216, a map of the magnetic field B1 of the RF pulse measured in Step S1203, and so on (S1207).

Next, in the second embodiment, the Q-value calculating unit 213 instructs the waveform-data supply unit 212 to supply the transmission signals having the amplitude and the phase of the RF shimming parameter h selected in Step S1207, to the channels actually from the pulse generator 201, and simultaneous irradiation with the RF pulse is performed. The Q-value calculating unit 213 receives the amplitude of the reflected wave of the channel from the power measuring device 202. In this manner, the reflection vector $S_{simul}$ including elements of reflection coefficients $S_{simul1}$, $S_{simul2}$, $S_{simul3}$, and $S_{simul4}$ which are generated in the channels 1 to 4 in the case where the transmission signals having the amplitudes and the phases of the RF shimming parameters h are simultaneously supplied to the channels 1 to 4, is actually measured. The simultaneous irradiation and the measurement of the amplitude of the reflected wave are performed for each frequency f at which the scattering matrix S is computed in Step S1214. The Q-value calculating unit 213 performs fitting of the absolute values of the measured reflection vector S to the LCR circuit model expressed in Expression (10) described above, and the values (specific values of the circuit elements) of L, C, and R are computed. The Q value ($Q_{loadedi}$), in a case where the load is applied, is calculated from the obtained values of L, C, and R, using Expression (11) (S1218). Since the Q value ($Q_{loadedi}$) is computed using the reflection vector S with which the simultaneous irradiation is actually performed, accuracy of the Q value ($Q_{loadedi}$) is higher than the Q value computed in Step S1216.

On the other hand, the Q-value calculating unit 213 computes, in advance, the S matrix with the complex numbers including the phase of no load using a method in a third embodiment which will be described below, from the absolute values $|S|$ of the S matrix of the no load which is computed in Step S1211, substitutes Expression (4) with the S matrix and the RF shimming parameter h in Step S1207, computes the reflected vector $S_{simul}$ including elements of the reflection coefficients $S_{simul1}$, $S_{simul2}$, $S_{simul3}$, and $S_{simul4}$, converts the reflection vector into the impedance Z, and computes the peak width $\delta f$ in a change in impedance Z and the like, and calculates Q value ($Q_{emptyi}$) by Expression (6), in the case where no load is applied (S1218). The Q value ($Q_{emptyi}$) has higher accuracy than that of the Q value computed in Step S1216.

The main imaging is performed, using the RF shimming parameter h selected in Step S1207. During the main imaging, the SAR calculating unit 215 computes calculates a whole-body SAR from traveling wave power, reflected wave power measured by the power measuring device 202, $Q_{loadedi}$, and $Q_{emptyi}$ computed in Step S1218, and the whole-body SAR is usually monitored during the main imaging. In this manner, the SAR management is performed during the scanning (S1209).

In the embodiment, configurations of the MRI apparatus other than the configuration described above, or the like are the same as the first embodiment and the description thereof is omitted.

Through the method described above, since it is possible to use the scattering matrix S, to which the coupling between the channels are added, in the optimal calculation of the RF shimming parameter, it is possible to improve accuracy of prediction of the whole-body SAR during the optimal calculation, and thus it is possible to achieve the SAR management with high accuracy and the optimization of homogeneity of B1+.

Third Embodiment

A third embodiment has a configuration in which the detector 200 is capable of detecting only the absolute-value, similar to the second embodiment; however, a phase component is calculated through computation, and the scattering matrix S including, as elements, the reflection coefficients of the complex numbers is calculated.

Hereinafter, the calculation method of the scattering matrix S of the embodiment is described using the flow in FIG. 8. First, the object 112 and the RF coil 103 are disposed in the imaging space of the MRI apparatus (Step S1221).

The reflection-coefficient determining portion 214 inputs the transmission signal to the channel 1, and causes the power measuring device 202 to measure the amplitude of the reflected waves of all of the channels (S1222). The frequency of the transmission signal is converted into a plurality of frequencies and the scattering matrices S are computed, respectively. The reflection-coefficient determining portion 214 computes, using Expression (9), the square root of a value obtained by dividing, by the amplitude $P_{fwdi}(freq)$ of the traveling wave, the amplitude $P_{refi}(freq)$ of the reflected wave measured by the power measuring device 202, and thereby calculates the elements $|S_{11}|$, $|S_{21}|$, $|S_{31}|$, and $|S_{41}|$ of the scattering matrix of Expression (3) (S1223).

Similar to Steps S1222 and S1223, components $|S_{ij}|$ of the scattering matrix for the channels 2 to 4 are calculated (S1224).

Of the elements of the computed scattering matrix, the diagonal-term components $|S_{11}|$, $|S_{22}|$, $|S_{33}|$, and $|S_{44}|$ are fitted to the LCR circuit model. expressed in Expression (10) described above, and values (specific values of circuit elements) of L, C, and R corresponding to $|S_{11}|$, $|S_{22}|$, $|S_{33}|$, and $|S_{44}|$ are computed (S1225).

As described above, the absolute values of the diagonal-term components of the scattering matrix S are fitted to the circuit models, respectively, the values of L, C, and R are obtained, and thereby it is possible to obtain phase of the circuit model as phase information of the channels. Therefore, it is possible to add the phase to the actually measured absolute values of the diagonal-term components of the scattering matrix S (S1225).

Phases of the non-diagonal-term components of the scattering matrix S are obtained as follows. Here, the non-diagonal-term components indicating the coupling between two channels of the plurality of channels are considered. For example, a case where reflection coefficients $S_{21}$ and $S_{12}$ indicating coupling between the channels 1 and 2 are computed is considered. Regarding $S_{21}$ and $S_{12}$, only absolute values thereof are now known. Since the RF coil 103 is normally configured only of a passive element, and a functional element such as the amplifier is not included, $S_{21}=S_{12}$. Hence, only $S_{12}$ may be obtained.

First, the transmission signals are simultaneously supplied to the channel 1 and the channel 2, the simultaneous irradiation is performed, and the detector 200 detects absolute values of the reflected waves of the channel 1 and channel 2. At this time, a phase difference θ between the transmission signal $h_1$ that is supplied to the channel 1 and the transmission signal $h_2$ that is supplied to the channel 2 is converted into a plurality of types, and the absolute values of the reflected waves are measured. For example, with $(h_1, h_2)=(1, \exp(i\theta))$, setting of θ=0, 0.2π, 0.4π, 0.6π, and 0.8π is performed, and the phase difference of the transmission signals is set.

In a case where the simultaneous irradiations are performed to the two channels, the reflection coefficient $S_1$ of the channel 1 which is actually measured is expressed as in Expression (12) using the phase difference θ of $h_1$ and $h_2$ and $|S_{11}|$ and $|S_{12}|$ obtained in Steps S1223 and S1224. α is an offset angle and represents a phase difference of $S_{12}$ with respect to $S_{11}$. Accordingly, substitution with the actually measured reflection coefficients $S_1$ and set θ, and $|S_{11}|$ and $|S_{12}|$ obtained in Steps S1223 and S1224 is performed in Expression (12), and thereby it is possible to obtain a phase component α of $S_{12}$ (S1227). At this time, θ is set as θ=0, 0.2π, 0.4π, 0.6π, and, 0.8π, for example. The phase component α for each θ is calculated; however, one of the calculated phase components α may be selected and the following steps may be used. An average value, a representative value, or the like of the plurality of calculated phase components α may be calculated, and then the following steps may be used. A phase component α, which is used in the following steps, is calculated from the plurality of calculated phase components α, and thereby it is possible to improve accuracy of the phase component α.

$$|S_1|=|S_{11}+S_{12}*\exp(i\theta)|=|S_{11}|+|S_{12}|*\cos(\theta+\alpha) \quad (12)$$

Similarly, the phase components of the other elements $S_{13}$, $S_{14}$, $S_{23}$, and $S_{24}$ of the scattering matrix S are obtained (S1228).

It is possible to obtain the scattering matrix S including phase information even in the MRI apparatus in which it is possible to measure only the absolute values of the reflected wave through the method described above, it is not possible to measure the phase.

The calculation method of the scattering matrix S in Steps S1222 to S1228 in FIG. 8 of the embodiment is performed instead of Step S1204 in the first embodiment, and thereby substantially the same effects as those in the first embodiment are achieved, even in the MRI apparatus that is capable of measuring only the absolute values of the reflected waves.

In the first and second embodiments described above, the method of calculating the Q value from the scattering matrix S and the method of fitting the diagonal components of the scattering matrix S, of which the elements are complex numbers, to the LCR circuit model, obtaining the values of L, C, and R, and calculating the Q value from the values of L, C, R are described; however, the calculation method is not limited to the methods described in the first and second embodiments, and it is possible to use various other methods.

For example, the scattering matrix S is converted into a matrix Z having impedance as the elements in the following Expression (13). Here, E represents a diagonal matrix in which the diagonal terms are all 1. Q values are calculated for the obtained diagonal-term components of the matrix Z using Expression (6) described above. Expression (13) is a matrix form of Expression (5) described above.

$$Z=Z_0(E-S)^{-1}(E+S) \quad (13)$$

Next, the SAR management in the first to third embodiments will be more specifically described. The SAR calculating unit 215 predicts the SAR and controls through actual measurement. In the prediction of the SAR, the scattering matrix S with the load applied is useds as described in the first to third embodiments. In addition, in pre-scanning, reference power, with which hydrogen spins collapse by 90 degrees at imaging sites of the object, is also measured.

The SAR calculating unit 215 predicts the SAR using the reference power with which the hydrogen spins obtained in the pre-scanning collapse by 90 degrees, the RF shimming parameters h which are used in the main imaging, the scattering matrix S or the reflection vector $S_{simul}$ with the load or without load, and the waveform, the intensity, and the frequency of the RF pulse of continuous imaging sequence. Specifically, the object power consumption $P_{object}$ as the power applied to the object 112 from the channels is computed using the Expression (7) described above, and an average of a total of the object power consumption $P_{object}$, which is applied by all of the channels in ten seconds and six minutes is obtained as the SAR. The whole-body SAR is computed by dividing $P_{object}$ by the weight of the object. Determination of whether or not the calculation result conforms with the safety standards such as the international electrotechnical commission standards (IEC) and, for example, a standard of 3 watts or less per 1 kg of weight is performed and control is performed such that the result conforms with the standards when the values do not conform with the standards and the reference.

Next, in a case where the predicted value of the SAR does not conform with the conditions set in the safety standards described above, for example, the SAR calculating unit 215 sets a pause period during the imaging, and thereby controlling is performed such that the SAR does not exceed condition values set in the standards, that is, the result conforms with the safety standards. Otherwise, the waveform, the intensity, or the frequency of the RF pulse changes and controlling is performed such that the result values conform with the safety standards.

The power measuring device 202 continually measures the RF pulse with which the object is irradiated after the main imaging starts. In a case where a value measured by the measuring device 202 exceeds an assumed margin, compared to the predicted value, the SAR calculating unit 215 determines that safety problems arise, outputs a warning, and the apparatus is subjected to emergency stop.

A difference between the prediction and measurement of the SAR occurs when a value used as $P_{input}$ is different in Expression (7). In the prediction, $P_{input}$ is computed using the reference power with which collapse by 90 degrees occurs, and from the waveform, the intensity, and the frequency of the RF pulse of the subsequent imaging sequence and the prediction is performed; however $P_{input}$ is actually measured in actual measurement.

As described above, according to the embodiment, even in a case where the RF antenna includes the plurality of channels, the scattering matrix is calculated using a value that can be measured by existing hardware of the MRI apparatus, further the Q value is calculated using the reflection vectors of the simultaneous irradiation with the RF shimming parameters, and thereby it is possible to estimate the whole-body SAR more accurate than that in the related art. In other words, according to the embodiment, it is possible to perform the SAR management with high accuracy by avoiding overvaluation of the SAR calculation value without an increase in costs of the apparatus.

In the SAR management in the MRI imaging in the related art, since an impact is produced due to the coupling between the channels, the SAR is overestimated when the SAR is estimated simply using only the diagonal terms of the scattering matrix S. As a result, problems arise in that there are disadvantages such as prolonging of imaging time, degradation of an image quality, a decrease in the number of images, or the like. In addition, in order to perform the accurate estimation, it is necessary to measure the reflection coefficients of all of the channels of the RF antenna 103 for each imaging site of the patient, that is, to measure the amplitudes and phases of the traveling waves and the reflected waves. In order to perform this, an expensive measuring device needs to be prepared and it takes a long time to perform measurement.

In this respect, according to the embodiment, it is possible to solve such problems in the related art, it is possible to obtain the whole-body SAR with high accuracy and it is possible to perform accurate SAR management using the highly accurate whole-body SAR, without adding new hardware to the MRI apparatus 100 and without an increase in the burden of the patient.

Note that, in the embodiments described above, an example in which the SAR management is performed in the MRI apparatus is described; however the application is not limited to the MRI apparatus, and it is possible to be applied to any apparatuses in which it is necessary to perform the management of the SAR by using electromagnetic waves having frequencies of several kHz to several GHz and by applying transmission power of the electromagnetic waves or the transmission power to the human body. For example, it is also possible to apply the embodiments to known Transmit SENSE technique, spoke excitation technique in a developing movement, or the like. In the method of the RF shimming, the phase and the amplitude of the irradiation channels are set to be different for each channel during the RF irradiation once; however, the RF waveform is the same in the channels, and the RF shimming parameter "h" does not change during the RF irradiation. On the other hand, in the Transmit SENSE technique or the spoke excitation technique, a single RF irradiation waveform is divided into strips in time, and the different RF shimming parameter "h" is set for each strip. In other words, in a case where one RF irradiation waveform is divided into a total of K times, K types of RF shimming parameters are set, and the number of times of computation of S vectors of the simultaneous irradiation and the number of times of computation of the whole-body SAR increase to the equivalent amount. However, since the RF shimming does not change, the specific computation method of the SAR can be also applied to the Transmit SENSE technique or the spoke excitation technique.

Note that embodiments of the invention is not limited to the embodiments described, and it is possible to perform various types of addition, modifications, and the like within a range without departing from the gist of the invention.

What is claimed is:

1. A magnetic resonance imaging apparatus comprising:
   a radiofrequency antenna that irradiates an object disposed in an imaging space, with a radiofrequency pulse;
   a Q-value calculating unit that computes a Q value of the radiofrequency antenna; and
   an SAR calculating unit that calculates a predicted value of a specific absorption rate in the object which is to be irradiated with a radiofrequency pulse from the radiofrequency antenna, using the Q value,
   wherein the radiofrequency antenna includes a plurality of channels, and
   wherein the Q-value calculating unit computes reflected signals of the plurality of channels of the radiofrequency antenna, respectively, where transmission signals as electrical signals are to be simultaneously applied to the plurality of channels of the radiofrequency antenna, also including a signal obtained when the transmission signal supplied to one channel of the plurality of channels is reflected from another channel, and computes a Q value of the radiofrequency antenna using the reflected signal.

2. The magnetic resonance imaging apparatus according to claim 1, further comprising:
   a detector that detects the reflected signal for each of the channels,
   wherein the Q-value calculating unit includes a reflection-coefficient determining portion that repeatedly performs, on the plurality of channels, an operation of supplying a transmission signal as an electrical signal to one channel of the plurality of channels of the radiofrequency antenna, and causing the detector to detect a reflected signal of the transmission signal from the radiofrequency antenna for each of the plurality of channels, and thereby that computes a scattering matrix as a set of reflection coefficients for the channels, respectively, and computes the Q value using the scattering matrix computed by the reflection-coefficient determining portion.

3. The magnetic resonance imaging apparatus according to claim 2,
   wherein the reflection-coefficient determining portion computes the reflection coefficient for each combination of a channel that has received the transmission signal with a channel that has output the reflected signal.

4. The magnetic resonance imaging apparatus according to claim 2,
   wherein the reflection-coefficient determining portion computes the scattering matrix obtained in a state in which the object is disposed in the imaging space, and
   wherein the Q-value calculating unit computes the Q value using the scattering matrix computed in advance in a state in which the object is not disposed and the scattering matrix computed by the reflection-coefficient determining portion in a state in which the object is disposed.

5. The magnetic resonance imaging apparatus according to claim 4,
wherein the Q-value calculating unit computes components of a vector which is obtained by multiplying the scattering matrix by a vector of which components are the transmission signals that are simultaneously supplied to the plurality of channels, divides the transmission signals by the components of the vector, respectively, thereby obtains a reflection vector representing a reflected signal for each channel, and calculates the Q value using the reflection vector.

6. The magnetic resonance imaging apparatus according to claim 2,
wherein the detector detects an absolute-value component and a phase component of the reflected signal, and
wherein the reflection-coefficient determining portion computes the reflection coefficient as a complex number, using the absolute-value component and the phase component of the reflected signal.

7. The magnetic resonance imaging apparatus according to claim 5,
wherein the Q-value calculating unit converts the transmission signal for each of the channels into a plurality of types of transmission signals, obtains corresponding reflection vectors, and calculates the Q value using a plurality of the reflection vectors,
wherein the SAR calculating unit calculates the specific absorption rate for each of the plurality of types of transmission signals, using the Q value, and
wherein the Q-value calculating unit selects, as a main imaging transmission signal, a combination of the transmission signals having the specific absorption rate within a predetermined range.

8. The magnetic resonance imaging apparatus according to claim 7,
wherein the Q-value calculating unit selects the main imaging transmission signal in a condition in which homogeneity of magnetic field distribution of the RF pulse with which irradiation is performed in response to the transmission signal has a predetermined value or lower, in addition to the condition in which the specific absorption rate is within a predetermined range.

9. The magnetic resonance imaging apparatus according to claim 2,
wherein the detector detects only an absolute-value component of the reflected signal,
wherein the reflection-coefficient determining portion computes the scattering matrix using only the absolute-value component of the reflected signal, and
wherein the Q-value calculating unit calculates the Q value from the computed scattering matrix using only the absolute-value component, further computes a combination of the transmission signals of which a predicted value of a specific absorption rate is within a predetermined range, for each of the channels, from a predicted value of a specific absorption rate computed by the SAR calculating unit using the Q value, then, actually supplies, to each of the channels, the computed combination of the transmission signals for each of the channels, and thereby again calculates the Q value using the reflected signal for each of the channels which is actually detected by the detector.

10. The magnetic resonance imaging apparatus according to claim 2,
wherein the detector detects only an absolute-value component of the reflected signal,
wherein the reflection-coefficient determining portion computes the scattering matrix using only the absolute-value component, and
wherein the Q-value calculating unit computes a circuit model that is fitted to absolute values of diagonal-term components of the scattering matrix and calculates phases of the diagonal-term components by computing phase information of the circuit model.

11. The magnetic resonance imaging apparatus according to claim 10,
wherein the Q-value calculating unit computes a characteristic value of a circuit element of the circuit model by the fitting and calculates the phase information from the characteristic value of the circuit element.

12. The magnetic resonance imaging apparatus according to claim 10,
wherein the Q-value calculating unit supplies a transmission signal having a predetermined phase difference to two channels of the plurality of channels and calculates non-diagonal-term components of the scattering matrix from the absolute value of the transmission signal detected by the detector and the absolute value of the reflected signal.

13. The magnetic resonance imaging apparatus according to claim 1, further comprising:
a cable which is connected to each channel of the RF antenna and via which the transmission signal is supplied; and
a waveform detector which detects a waveform through sampling of a reception signal that is output from the RF antenna after the RF antenna receives an NMR signal that is generated from the object irradiated with the radiofrequency pulse,
wherein a wire is disposed between the cable and the waveform detector and a part of the reflected signal is input via the wire to the waveform detector from the channel that is transmitted via the cable, and the waveform detector also detects a waveform of the reflected signal.

14. An operating method of a magnetic resonance imaging apparatus that includes a radiofrequency antenna that has a plurality of channels and irradiates an object disposed in an imaging space, with a radiofrequency pulse, and an SAR calculating unit that calculates a predicted value of a specific absorption rate in the object, using a Q value of the radiofrequency antenna which is to be irradiated with a radiofrequency pulse from the radiofrequency antenna, the method comprising:
computing reflected signals of the plurality of channels of the radiofrequency antenna, respectively, where transmission signals as electrical signals are to be simultaneously supplied to the plurality of channels of the radiofrequency antenna, also including a signal obtained when the transmission signal supplied to one channel of the plurality of channels is reflected from another channel; and
computing a Q value of the radiofrequency antenna using the reflected signal.

* * * * *